US010919408B2

(12) United States Patent
Sarwar et al.

(10) Patent No.: US 10,919,408 B2
(45) Date of Patent: Feb. 16, 2021

(54) CONTROLLING OPERATION OF DEVICE WITH RECHARGEABLE ENERGY STORAGE PACK BASED ON PROPULSION LOSS ASSESSMENT

(71) Applicant: GM Global Technology Operations LLC, Detroit, MI (US)

(72) Inventors: Azeem Sarwar, Rochester Hills, MI (US); Xiangxing Lu, Mountain View, CA (US); Ciro Spigno, Waterford, MI (US); Ryan B. Moulliet, Farmington Hills, MI (US); Jeffrey S. Piasecki, Rochester, MI (US); Andrew J. Cornelli, Clawson, MI (US); Charles W. Wampler, II, Birmingham, MI (US); Brian J. Koch, Berkley, MI (US); Margaux LeBlanc, West Bloomfield, MI (US); Gus Hatoum, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 254 days.

(21) Appl. No.: 16/214,813

(22) Filed: Dec. 10, 2018

(65) Prior Publication Data

US 2020/0180466 A1 Jun. 11, 2020

(51) Int. Cl.
*B60L 58/10* (2019.01)
*H01M 10/00* (2006.01)
(Continued)

(52) U.S. Cl.
CPC .......... *B60L 58/10* (2019.02); *G01R 31/3647* (2019.01); *G01R 31/382* (2019.01);
(Continued)

(58) Field of Classification Search
CPC ..... B60L 58/10; H01M 10/482; H02J 7/0021; G01R 31/396; G01R 31/3647
(Continued)

(56) References Cited

U.S. PATENT DOCUMENTS

2011/0031048 A1* 2/2011 Ohkura ................ G01R 31/396
180/65.1
2015/0380787 A1* 12/2015 Ishii ........................ B60L 58/21
429/9

(Continued)

FOREIGN PATENT DOCUMENTS

JP          2017077808 A  *  4/2017
WO    WO-2012123984 A1  *  9/2012  ............ B60W 10/06

OTHER PUBLICATIONS

Yin et al., Chinese Patent Document No. CN 206654181, published Nov. 21, 2017, abstract and 1 drawing. (Year: 2017).*

*Primary Examiner* — Phallaka Kik
(74) *Attorney, Agent, or Firm* — Quinn IP Law

(57) ABSTRACT

System and method of controlling operation of a device having a rechargeable energy storage pack with a plurality of cells, based on propulsion loss assessment. A controller is configured to obtain a state of charge data and an open circuit voltage of the rechargeable energy storage pack. The controller is configured to obtain a state of charge disparity factor (dSOC) from a selected dataset. The state of charge disparity factor (dSOC) is defined as a difference between a minimum value of the state of charge and an average value of the state of charge of the plurality of cells. The controller is configured to control operation of the device based in part on the state of charge disparity factor (dSOC) and a plurality of parameters ($P_i$), including raising one or more of a plurality of flags each transmitting respective information to a user.

19 Claims, 3 Drawing Sheets

(51) Int. Cl.
*H02J 7/00* (2006.01)
*G01R 31/382* (2019.01)
*G01R 31/396* (2019.01)
*G01R 31/36* (2020.01)
*H01M 10/48* (2006.01)

(52) U.S. Cl.
CPC ........ *G01R 31/396* (2019.01); *H01M 10/482* (2013.01); *H02J 7/0021* (2013.01)

(58) Field of Classification Search
USPC .................. 320/132, 135, 152, 159, 164
See application file for complete search history.

(56) References Cited

U.S. PATENT DOCUMENTS

2016/0268651 A1* 9/2016 Arai .................. H02J 7/0026
2019/0023369 A1* 1/2019 Gjerpe ................ B60L 3/0092

\* cited by examiner

CONTROLLING OPERATION OF DEVICE WITH RECHARGEABLE ENERGY STORAGE PACK BASED ON PROPULSION LOSS ASSESSMENT

INTRODUCTION

The present disclosure relates in general to a system and method of controlling operation of a device having a rechargeable energy storage pack. The use of purely electric vehicles and hybrid vehicles, such as battery electric vehicles, window extended electric vehicles, hybrid electric vehicles, plug-in hybrid electric vehicles and fuel cell hybrid electric vehicles, has greatly increased over the last few years. The source of propulsion for hybrid electric vehicles, purely electric vehicles and other electric-powered transportation devices is generally a rechargeable energy storage unit with a number of cells.

SUMMARY

Disclosed herein are a system and method of controlling operation of a device with a rechargeable energy storage pack based on propulsion loss assessment. The rechargeable energy storage pack has a plurality of cells. The system includes a controller having a processor and tangible, non-transitory memory on which is recorded instructions. Execution of the instructions by the processor causes the controller to obtain a state of charge data and an open circuit voltage of the rechargeable energy storage pack. The controller is configured to determine a first SOC line and a second SOC line such that a ratio of the state of charge data and the open circuit voltage is a constant between the first SOC line and the second SOC line, the state of charge data at and above the first SOC line being defined as the selected dataset.

The controller is configured to obtain a state of charge disparity factor (dSOC) from the selected dataset. The state of charge disparity factor (dSOC) is defined as a difference between a minimum value of the state of charge of the plurality of cells and an average value of the state of charge of the plurality of cells. The controller is configured to obtain a plurality of parameters ($P_i$), based in part on the state of charge disparity factor (dSOC). The controller is configured to control operation of the device based in part on the state of charge disparity factor (dSOC) and the plurality of parameters ($P_i$), including raising one or more of a plurality of flags each transmitting respective information to a user. For example, a local user may receive the respective information via a user interface in the device, and a user located remotely may receive the respective information through a management unit.

The plurality of parameters ($P_i$) may include a disparity mean ($M_t$) obtained over a window size of W data transmissions. The disparity mean ($M_t$) at the time t may be defined as:

$$M_t = \frac{1}{W}\sum_{i=0}^{W-1} dSOC_{t-i}.$$

The plurality of parameters ($P_i$) may include a disparity slope ($S_t$) obtained over the window size of W data transmissions and based in part on the disparity mean ($M_t$). The disparity slope ($S_t$) at the time t may be defined as:

$$S_t = \frac{\sum_{i=0}^{W-1}\left[\left(t-i-\frac{2t-W+1}{2}\right)*(dSOC_{t-i}-M_t)\right]}{\sum_{i=0}^{W-1}\left(t-i-\frac{2t-W+1}{2}\right)^2}.$$

The plurality of parameters ($P_i$) may include a disparity standard deviation ($SD_t$) obtained over the window size of W data transmissions and based in part on the disparity mean ($M_t$). The disparity standard deviation ($SD_t$) at the time t may be defined as:

$$SD_t = \sqrt{\frac{\sum_{i=0}^{W-1}(dSOC_{t-i}-M_t)^2}{W-1}}.$$

The controller may be configured to determine if the plurality of parameters ($P_i$) are each above respective thresholds ($T_i$), and if the state of charge disparity factor is greater than a disparity threshold (dSOC>X). If at least one of each of the plurality of parameters ($P_i$) each being above the respective thresholds ($T_i$) and the state of charge disparity factor being greater than the disparity threshold (dSOC>X) is true, and has an occurrence above a first frequency threshold ($F_1$), then the controller is configured to raise a first one of the plurality of flags.

A charge-less parking instance may be established if a difference in an odometer reading of the device at a time t and the odometer reading at the time t−1 is zero and an absolute value of a difference in the state of charge at the time t versus the state of charge at the time t−1 is less than a noise threshold. If the current data transmission was collected after a charge-less parking instance and a number of days that the device had been parked is greater than a predefined parking time threshold, then prior to obtaining the plurality of parameters, the controller may be configured to modify the state of charge disparity factor by an off-time correction factor. The off-time correction factor may be based in part on the number of days that the device was parked.

If the current data transmission was collected after a charge-less parking instance, then the controller may be configured to determine an average cell recovery ($ABS[V_{t,\ avg}-V_{t-1,\ avg}]$) as an absolute value of a difference between an average voltage at the time t and the average voltage at the time t−1, as well as determine a minimum cell recovery ($ABS[V_{t,\ min}-V_{t-1,\ min}]$) as the absolute value of a difference between a minimum voltage at the time t and the minimum voltage at the time t−1. If an absolute value of a difference between the average cell recovery and the minimum cell recovery is non-zero and has an occurrence above a second frequency threshold ($F_2$), then the controller is configured to raise a second one of the plurality of flags.

If the current data transmission was collected after at least one of a charging instance and a driving instance, prior to obtaining the plurality of parameters, the controller may be configured to modify the state of charge disparity factor by a balancing correction factor. The balancing correction factor may be based in part on a duration of the at least one of the charging instance and the driving instance.

The controller may be configured to determine a theoretical minimum state of charge based in part on a predefined buffer and a lowest value of the state of charge within a predefined past period prior to a charging event. The controller may be configured to determine a theoretical time for the state of charge disparity factor (dSOC) to reach the theoretical minimum state of charge. If the theoretical time is greater than a calibrated time, then the controller is configured to raise a third one of the plurality of flags.

The system may include a current sensor and a voltage sensor operatively connected to the rechargeable energy storage pack and configured to provide respective data to the controller. The state of charge data may be based in part on the respective data from at least one of the current sensor and the voltage sensor.

The above features and advantages and other features and advantages of the present disclosure are readily apparent from the following detailed description of the best modes for carrying out the disclosure when taken in connection with the accompanying drawings.

DETAILED DESCRIPTION

Figure 1:
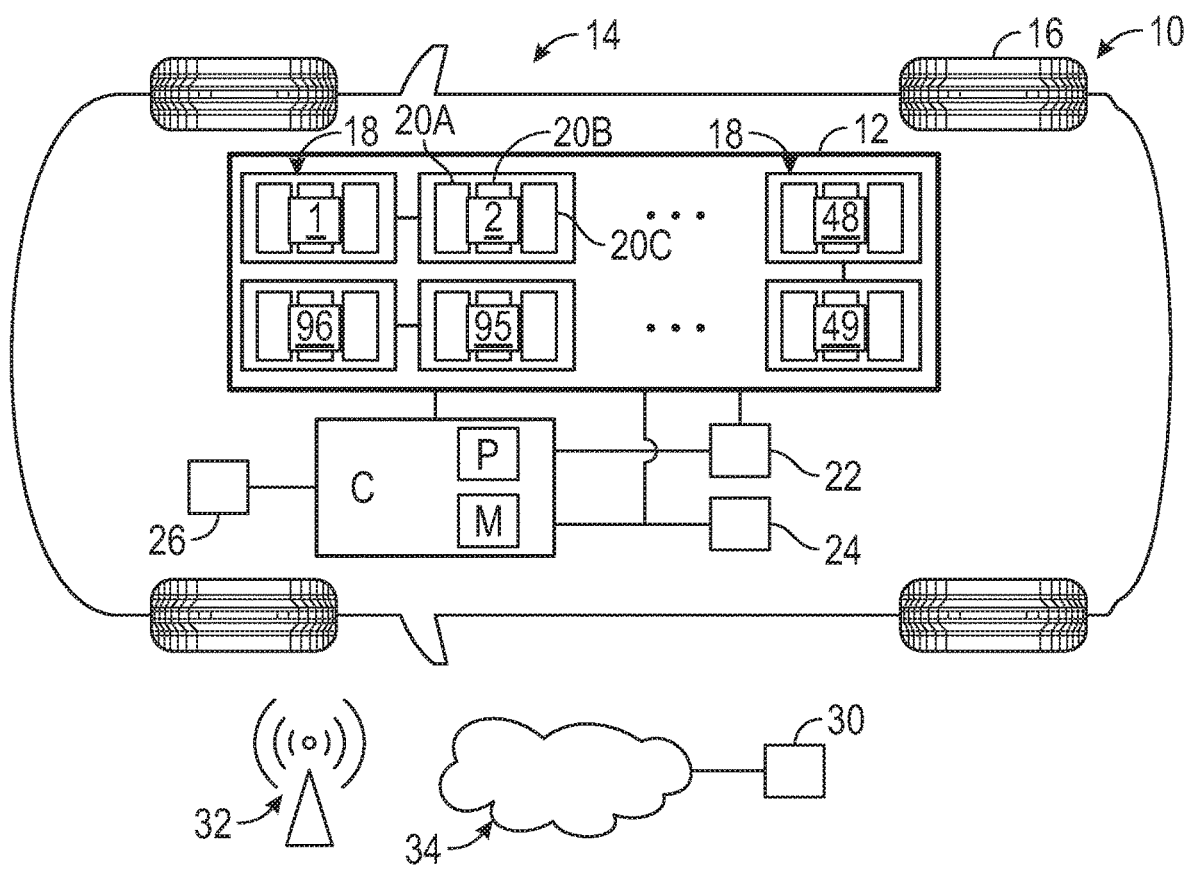
FIG. 1 is a schematic diagram of a system for controlling operation of a device having a rechargeable energy storage pack and a controller.

Referring to the drawings, wherein like reference numbers refer to like components, FIG. 1 schematically illustrates a system 10 for controlling operation of a device 14 having a rechargeable energy storage pack 12. The rechargeable energy storage pack 12 may include battery cells of different chemistries, including but not limited to, lithium-ion, lithium-iron, nickel metal hydride and lead acid batteries. The device 14 may be a mobile platform, such as, but not limited to, standard passenger car, sport utility vehicle, light truck, heavy duty vehicle, ATV, minivan, bus, transit vehicle, bicycle, robot, farm implement, sports-related equipment, boat, plane, train or other transportation device. In the embodiment shown in FIG. 1, the device 14 includes at least one wheel 16. The device 14 may take many different forms and include multiple and/or alternate components and facilities.

Referring to FIG. 1, the rechargeable energy storage pack 12 includes a plurality of cells 18, which may be connected in series, in parallel or a combination of both. Each of the plurality of cells 18 may include one or more sub-cells, such as first sub-cell 20A, second sub-cell 20B and third sub-cell 20C. While the example in FIG. 1 shows 96 cells (see cell 1, cell 2, cell 48, cell 49, cell 95, cell 96 in FIG. 1), it is understood that the number of cells and sub-cells in the rechargeable energy storage pack 12 may be varied based on the application at hand.

Figure 3:
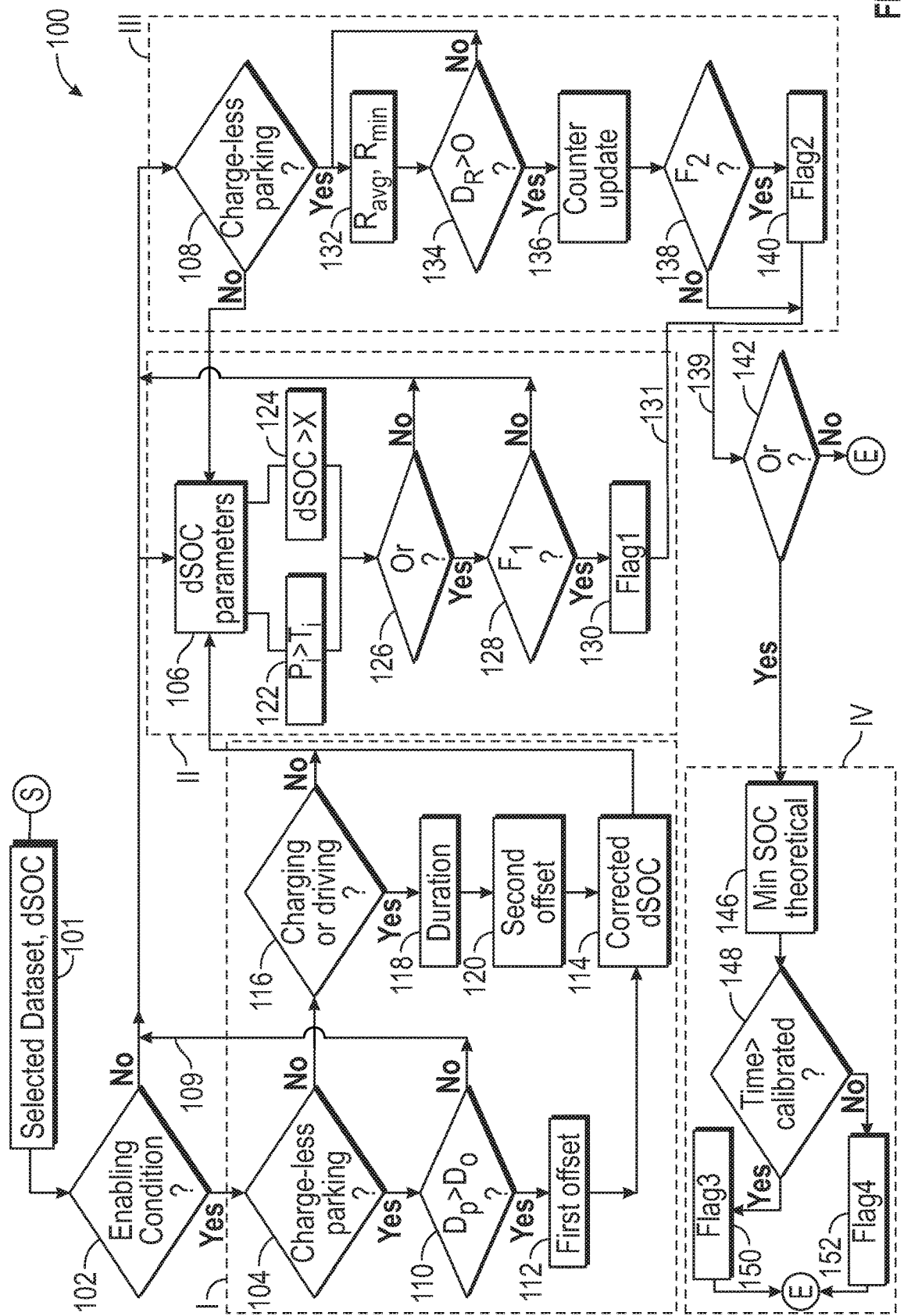
FIG. 3 is a schematic flow diagram of a method executable by the controller of FIG. 1.

Referring to FIG. 1, a controller C is in communication with the rechargeable energy storage pack 12. The controller C includes at least one processor P and at least one memory M (or non-transitory, tangible computer readable storage medium) on which are recorded instructions for executing a method 100, described below with reference to FIG. 3. The memory M can store controller-executable instruction sets, and the processor P can execute the controller-executable instruction sets stored in the memory M. Referring to FIG. 3, the method 100 incorporates a number of propulsion loss assessment modules, such as a first assessment module I, a second assessment module II, a third assessment module III and a fourth assessment module IV.

Referring to FIG. 1, the system 10 may include a user interface 26 for displaying information and facilitating communication between the controller C and a user of the device 14. The user may include but is not limited to, a passenger of the device 14, an owner of the device 14 and a company that operates a fleet of devices 14. For example, the device 14 may be owned and operated by a ridesharing company and the user may be an employee of the company. The user may receive information (which may be visual, audible or in another form) from the user interface 26.

Referring to FIG. 1, the controller C may be configured to communicate with a user located remotely from the device 14, via a management unit 30. In one embodiment, the controller C may communicate with the management unit 30 via an access point 32 and a wireless network 34. The access point 32 is employed to broadcast a wireless signal that various devices can detect and "tune" into. The wireless network 34 may be a Wireless Local Area Network (LAN) which links multiple devices using a wireless distribution method. The wireless network 34 may be a Wireless Metropolitan Area Network (MAN) which connects several wireless LANs. The wireless network 34 may be a Wireless Wide Area Network (WAN) which covers large areas such as neighboring towns and cities. The wireless network 34 may include Bluetooth™ connectivity. Bluetooth™ is an open wireless technology standard for transmitting fixed and mobile electronic device data over short distances and creates personal networks operating within the 2.4 GHz band. It is to be understood that other types of connection may be employed. The management unit 30 and wireless network 34 may employ circuitry and components that are available to those skilled in the art.

Referring to FIG. 1, a voltage sensor 22 is configured to communicate the voltage of the rechargeable energy storage pack 12 to the controller C. A current sensor 24 is configured to provide current data for the rechargeable energy storage pack 12. The controller C may be configured to send out information, referred to herein as a data transmission, to the management unit 30. In one example, the controller C employs a Ping software utility which operates by sending Internet Control Message Protocol (ICMP) echo request packets to a target host and waiting for an ICMP echo reply. Each data ping represents one data collection instance. The controller C may be configured to send out a data transmission each time the device 14 is powered on and off. The data transmission may include, but is not limited to the current, voltage, state of charge of the rechargeable energy storage pack 12 and odometer reading of the device 14. For example, the device 14 may be configured to send out two data transmissions per trip, one at the start and one at the end of the trip. It is to be understood that the number of data transmissions may be varied based on the application at hand.

Figure 2:
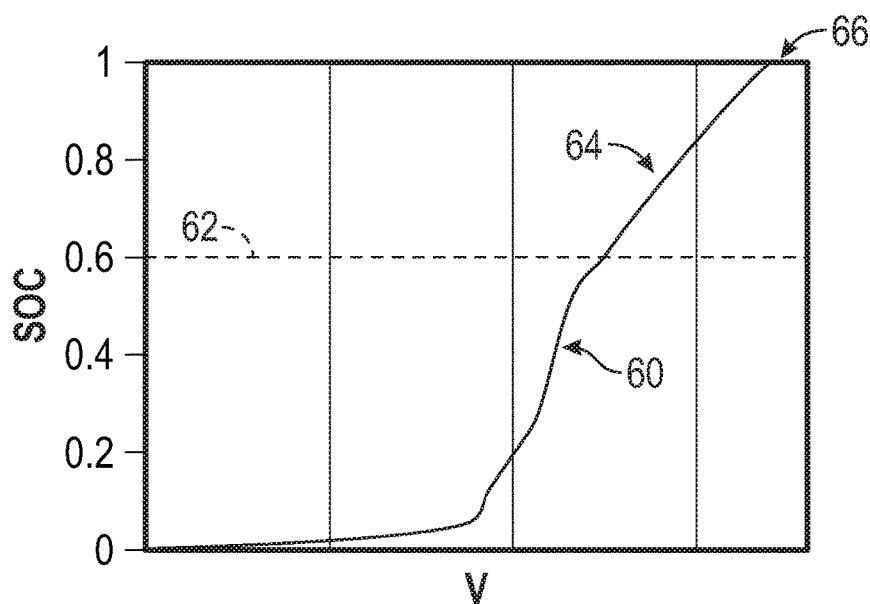
FIG. 2 is a schematic example graph showing state of charge (SOC) relative to voltage (V) for the rechargeable energy storage pack of FIG. 1.

FIG. 2 is a schematic example of a trace 60 depicting the state of charge (SOC in FIG. 2) of the rechargeable energy storage pack 12 in the vertical axis and the open circuit voltage (V in FIG. 2) in the horizontal axis. The open circuit voltage is understood to be the voltage of a circuit with no load. The state of charge (SOC) of the rechargeable energy storage pack 12 may be estimated based on the data from the current sensor 24, the voltage sensor 22 and various mathematical models available to those skilled in the art. The state of charge refers to the stored charge available to do work relative to that which is available after the rechargeable energy storage pack 12 has been fully charged. The state of charge may be viewed as an assessment of the potential energy of the rechargeable energy storage pack 12, extending between a minimum of 0% and a maximum of 100%.

The state of charge and its derivative factors impact efficiency and power availability of the device 14 and may be employed for the purpose of regulating operation of the device 14. Referring to FIG. 3, operation of the device 14 may be controlled via a plurality of flags, such as the first flag in block 130, second flag in block 140, third flag in block 150 and fourth flag in block 152. Each flag may include a specific message to be communicated to a local user via the user interface 26 or a remote user via the management unit 30. The flags may request the user to maintain a state of charge above a respective percentage until the rechargeable energy storage pack 12 may be serviced or replaced. For example, the first flag in block 130 may indicate to a user that the first assessment module I indicates an issue that needs further evaluation. This information enables a user managing a fleet of such devices 14 to schedule the device for servicing as well as how soon the servicing should be scheduled. The information provided by the flags enables the servicing personnel to narrow or pinpoint the issues needing evaluation.

Referring now to FIG. 3, a flowchart of the method 100 stored on and executable by the controller C of FIG. 1 is shown, with start and end denoted by "S" and "E," respectively. Method 100 need not be applied in the specific order recited herein. Furthermore, it is to be understood that some steps may be eliminated. The method 100 may be dynamically executed. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine. The method 100 may run continuously while the device 14 is powered on.

The method 100 may begin with block 101 of FIG. 3, where the controller C is programmed to obtain a selected dataset. Referring to FIG. 2, a state of charge and an open circuit voltage of the rechargeable energy storage pack 12 (see trace 60) is obtained by the controller C. Referring to FIG. 2, the controller C is configured to determine a first SOC line 62 and a second SOC line 66 such that a linear region 64 between the first SOC line 62 and the second SOC line 66 has a constant slope, i.e., a ratio of (SOC/V) is a constant between the first SOC line 62 and the second SOC line 66. In the non-limiting example shown in FIG. 2, the first SOC line 62 is at 0.6 (60%). The state of charge at and above the first SOC line 62 is defined as the selected dataset.

Figure 4:
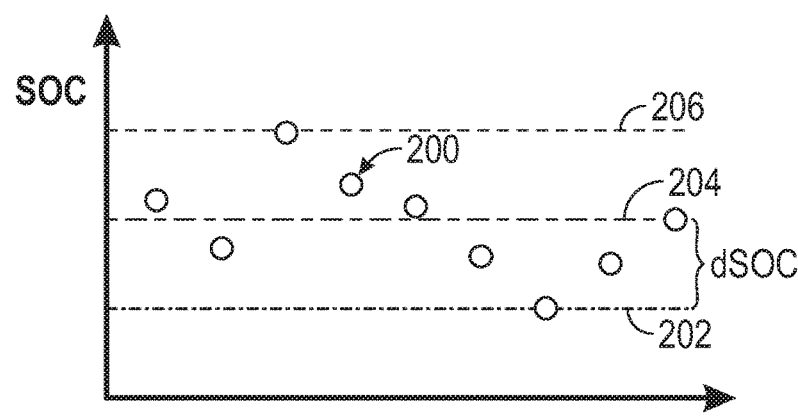
FIG. 4 is a schematic example graph showing state of charge values for a plurality of cells in the rechargeable energy storage pack of FIG. 1.

Per block 101, the controller C is programmed to obtain a state of charge disparity factor (dSOC) from the selected dataset. FIG. 4 is a schematic example graph showing the state of charge for the rechargeable energy storage pack 12. Each point 200 represents the state of charge for one of the plurality of cells 18. The minimum state of charge of the plurality of cells 18 is indicated by line 202. The average state of charge is indicated by line 204, while the maximum state of charge of the plurality of cells 18 is indicated by line 206. In a rechargeable energy storage pack 12 with N cells, the state of charge disparity factor (dSOC) at a time t is defined as a difference between the average state of charge (see line 204 of FIG. 4) of the N cells and the minimum state of charge (see line 202 of FIG. 4) of the N cells, as follows:

$$dSOC_t = \left(\frac{1}{N}\sum_{i=0}^{N} SOC_{t-i}\right) - (\text{minimum} SOC_t \text{ of the } N \text{ cells})$$

Figure 5:
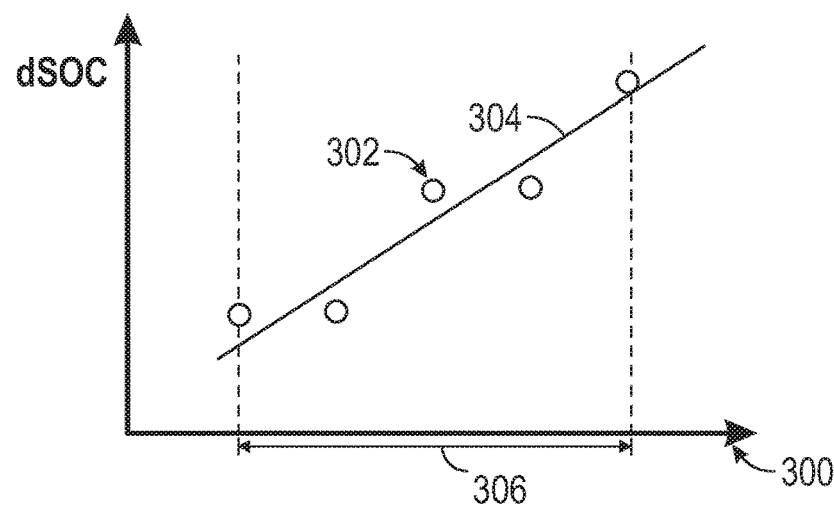
FIG. 5 is a schematic example graph showing a state of charge disparity factor (dSOC) over a predefined time window for the rechargeable energy storage pack of FIG. 1.

Referring to FIG. 5, a schematic example graph is shown of the state of charge disparity factor (dSOC) for the rechargeable energy storage pack 12, with the horizontal axis 300 indicating time. The plurality of points 302 reflect the state of charge disparity factor (dSOC) at different times over a window 306.

Per block 102 of FIG. 2, the controller C is configured to determine if an enabling condition is met. If so, the method 100 proceeds to block 104 (first assessment module I). If not, the method 100 proceeds to block 106 (second assessment module II) and block 108 (third assessment module III), to be described below. For example, the enabling condition may be that an off-time mode of the device 14 has been enabled. The off-time mode may be disabled when the first assessment module I is not needed.

In block 104 of FIG. 3, the controller C is configured to determine if the current data transmission has been collected after a charge-less parking instance. If so, the method 100 proceeds to block 110. If not, the method 100 proceeds to block 116, as described below. A charge-less parking instance may be established if a difference in an odometer reading of the device 14 at a time t and the odometer reading at the time t−1 is zero and an absolute value of a difference in the state of charge at the time t versus the state of charge at the time t−1 is less than a noise threshold. In other words:

($ODO_t$−$ODO_{t-1}$=0) and

ABS[$SOC_t$−$SOC_{t-1}$]<Noise Threshold (e.g. 2%).

In block 110, the controller C is configured to determine the number of days that the device 14 has been parked ($D_p$ in FIG. 3) and whether this is greater than a predefined parking time threshold ($D_0$ in FIG. 3). If so, the method 100 proceeds to block 112. If not, as indicated by line 109, the method 100 proceeds to block 106 (second assessment module II) and block 108 (third assessment module III). In block 112, the controller C is configured to determine an off-time correction factor to the state of charge disparity factor. If a device 14 has been parked for a long time without charging, the state of charge tends to drop and the state of charge disparity factor tends to increase without necessarily indicating a flaw. This is accounted for by the off-time correction factor.

Figure 6:
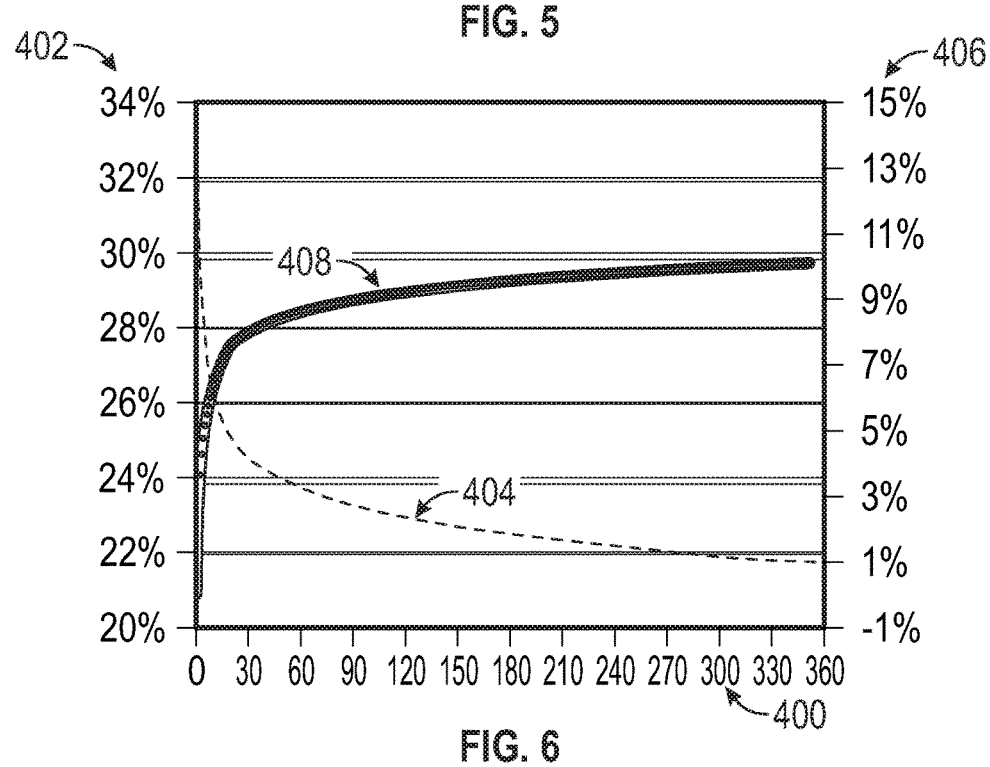
FIG. 6 is a schematic example graph showing the state of charge (SOC) and the state of charge disparity factor (dSOC) over time for the rechargeable energy storage pack of FIG. 1.

FIG. 6 is a schematic example graph showing the state of charge (SOC) and the state of charge disparity factor (dSOC) over time. The horizontal axis 400 indicates the number of days since cycling, without being charged or discharged. The first vertical axis 402 corresponds to a first trace 404, which indicates the state of charge (SOC) over time. As seen in FIG. 6, the state of charge (SOC) decays over time. The second vertical axis 406 corresponds to the second trace 408, which indicates the state of charge disparity factor (dSOC) over time. The state of charge disparity factor (dSOC) increases over time and approaches an asymptotic value. A look-up table may be created based on the observed behavior of the state of charge disparity factor (dSOC) over time.

For example, at 30 days, the increase in the state of charge disparity factor (dSOC) is approximately 8%. The off-time correction factor for a particular time duration may be set based on the look-up table, for this example the off-time correction factor is set as 8% when the time duration is 30 days. The method 100 proceeds to block 114 from block 112, to be described below.

Referring now to block 116 of FIG. 3, the controller C is configured to determine if the current data transmission was collected after a charging instance or a driving instance. If so, the method 100 proceeds to block 118 where controller C is configured to determine the charging duration (after a charging instance) or the driving duration (after a driving instance).

In block 120, the controller C is configured to determine a balance correction factor to the state of charge disparity factor, based in part on at least one of the charging duration and the driving duration. The device 14 may be programmed with a self-balancing remedy action for the pack 12 to automatically discharge the plurality of cells 18 with a higher state of charge to bring them down to a level which is closer to the plurality of cells 18 with the minimum value of the state of charge. The balance correction factor is a tuning or a calibration parameter accounting for this remedy action and may be arrived at by observing the average behavior of a number of devices similar to the device 14. For example, the amount of the state of charge disparity (dSOC) reduction taking place in healthy devices for every hour of driving is observed, and the balance correction factor is deduced from it. In a non-limiting example, the balance correction factor may be selected to be between 0.05% and 0.25% for every hour of driving.

Referring to FIG. 3, from block 112 and block 120, the method 100 proceeds to block 114, where the controller C is configured to determine a corrected state of charge disparity factor, based partially on at least one of the off-time correction factor and the balance correction factor, as follows:

Corrected State Of Charge Disparity Factor=dSOC−Current Offset.

Current Offset=Previous Offset+Off-Time Correction Factor, or

Current Offset=Previous Offset−Balance Correction Factor

The previous offset is the "current offset" from the iteration just prior to the current iteration. The previous offset may be initialized to zero in the first iteration of the method 100.

Referring to FIG. 3, in block 106 (second assessment module II), the controller C is configured to obtain a plurality of parameters ($P_i$) based in part on the state of charge disparity factor (dSOC). The plurality of parameters (at time t) are obtained in a respective predefined window. The plurality of parameters ($P_i$) may include a disparity mean ($M_t$) obtained over a window size of W data transmissions at a time t. The window size W may be tuned based on an iterative optimization process. The disparity mean ($M_t$) may be defined as:

$$M_t = \frac{1}{W}\sum_{i=0}^{W-1} dSCO_{t-i}.$$

The plurality of parameters ($P_i$) may include a disparity slope ($S_t$) obtained over the window size of W data transmissions at the time t and based in part on the disparity mean ($M_t$). Referring to FIG. 5, a schematic example graph is shown of the state of charge disparity factor (dSOC) for the rechargeable energy storage pack 12. The horizontal axis 300 indicates time. The plurality of points 302 reflect the state of charge disparity factor (dSOC) at different times. A line of best fit 304 is generated over the window 306. The slope ($S_t$) may be obtained from the line of best fit 304 at the window 306. The disparity slope ($S_t$) may be defined as:

$$S_t = \frac{\sum_{i=0}^{W-1}\left[\left(t-i-\frac{2t-W+1}{2}\right)*(dSOC_{t-i}-M_t)\right]}{\sum_{i=0}^{W-1}\left(t-i-\frac{2t-W+1}{2}\right)^2}.$$

The plurality of parameters ($P_i$) may include a disparity standard deviation ($SD_t$) obtained over the window size of W data transmissions at the time t and based in part on the disparity mean ($M_t$). The disparity standard deviation ($SD_t$) may be defined as:

$$SD_t = \sqrt{\frac{\sum_{i=0}^{W-1}(dSOC_{t-i}-M_t)^2}{W-1}}.$$

The plurality of parameters ($P_i$) may include a difference between the maximum value (see line 202 of FIG. 4) of the state of charge of the plurality of cells 18 and the minimum value (see line 206 of FIG. 4). The plurality of parameters ($P_i$) may include the state of charge disparity factor (dSOC) itself. It is to be understood that the plurality of parameters ($P_i$) may include a combination of one or more of the five parameters described above and other parameters based in part on the state of charge disparity factor (dSOC).

The method 100 proceeds from block 106 to block 122 and block 124. In block 122, the controller C is configured to determine if the plurality of parameters ($P_i$) are above a respective threshold ($T_i$), in other words, is ($P_i > T_i$). The respective thresholds may be set by calibration in a test cell or laboratory conditions by comparing healthy cells to cells with performance flaws. In a non-limiting example, the plurality of parameters ($P_1$, $P_2$, $P_3$, $P_4$ and $P_5$) and their respective thresholds ($T_1$, $T_2$, $T_3$, $T_4$ and $T_5$) may be defined as follows:

$P_1 = S_T$, $T_1$=between 0.1 and 0.5.
$P_2 = M_T$, $T_2$=between 2 and 6.
$P_3 = SD_T$, $T_3$=between 0.1 and 0.5.
$P_4$=dSOC, $T_4$=between 2% and 6%.
$P_5$=(maximum SOC−minimum SOC), $T_5$=between 3% and 8%.

In block 124 of FIG. 3, the controller C is configured to determine if the state of charge disparity factor is greater than a disparity threshold (dSOC>X). In one example, the disparity threshold (X) may be set in a range between 7% and 15%. The disparity threshold (X) is selected to be sufficiently high to indicate a concern. If the state of charge disparity factor (dSOC) is one of the plurality of parameters ($P_i$), the disparity threshold (X) is selected to be higher than the respective threshold ($T_i$).

Per block 126, if either of block 122 and block 124 is true (i.e. at least one condition in the block is true), the method 100 proceeds to block 128, the controller C is configured to determine if a first frequency threshold ($F_1$) is exceeded. Stated differently, once the criteria is met, the controller C is configured to check to see if it remains true with a sufficient frequency, in order to guard against transient situations, and enable better robustness of the decision. In one example, the first frequency threshold ($F_1$) is exceeded if either of block 122 and block 124 is true for 7 out of the 10 previous instances ($F_1$=7/10). The magnitude of the first frequency threshold ($F_1$) is selected based on the application at hand, with a greater the magnitude being selected for greater robustness.

If the first frequency threshold ($F_1$) is exceeded, the method 100 proceeds to block 130 where a first flag is raised. The first flag may be configured to encourage the user, via the user interface 26 of FIG. 1, to maintain the state of charge at a sufficient level until the rechargeable energy storage pack 12 can be serviced or replaced. In one example, the first flag in block 130 may indicate to service personnel located remotely (via the management unit 30) that the first assessment module I indicates an issue requiring further evaluation. The first flag may be configured to limit the power supplied by the rechargeable energy storage pack 12 to the device 14.

Referring now to the third assessment module III, per block 108 of FIG. 3, the controller C is configured to determine if the current data transmission has been collected after a charge-less parking instance. If so, the method 100 proceeds to block 132. If not, the method 100 exits the third assessment module III and proceeds to block 106. As noted above, a charge-less parking instance may be established if a difference in an odometer reading of the device at a time t and the odometer reading at the time t−1 is zero and an absolute value of a difference in the state of charge at the time t versus the state of charge at the time t−1 is less than a noise threshold. In other words:

($ODO_t-ODO_{t-1}$=0) and

ABS[$SOC_t-SOC_{t-1}$]<Noise Threshold (e.g. 2%).

In block 132 of FIG. 3, the controller C is configured to determine an average cell recovery ($R_{avg}$=ABS[$V_{t,\ avg}-V_{t-1,\ avg}$]) as an absolute value of a difference between an average voltage at the time t and the average voltage at the time t−1, and a minimum cell recovery ($R_{min}$=ABS[$V_{t,\ min}-V_{t-1,\ min}$]) as the absolute value of a difference between a minimum voltage at the time t and the minimum voltage at the time t−1. Here, the average and minimum cells are the cells with the average and minimum voltage across the rechargeable energy storage pack 12, respectively.

Per block 134, the controller C is configured to determine if an absolute value of the difference between the average cell recovery ($R_{avg}$) and the minimum cell recovery ($R_{min}$) is non-zero, i.e., $D_R$=ABS ($R_{avg}-R_{amin}$), $D_R$>0. If so, the method 100 proceeds to block 136, where a counter (which may be embedded in the controller C) is updated. If not, the method 100 proceeds back to block 132. From block 136, the method 100 proceeds to block 138, where the controller C is configured to determine if a second frequency threshold ($F_2$) is exceeded. For example, the second frequency threshold ($F_2$) may be exceeded if $D_R$>0 for 5 out of 100 previous parked instances. If the second frequency threshold ($F_2$) is exceeded, the method 100 proceeds to block 140 where a second flag is raised. The second flag may be configured to encourage the user, via the user interface 26 of FIG. 1, to maintain the state of charge at a sufficiently high level until the rechargeable energy storage pack 12 can be serviced or replaced. In one example, the second flag in block 140 may indicate to service personnel (via the management unit 30) that the third assessment module III indicates an issue requiring further evaluation. The second flag may be configured to limit the power supplied by the rechargeable energy storage pack 12 to the device 14.

The method 100 proceeds to block 142 from block 130 (as indicated by line 131), block 138 (if the second frequency threshold ($F_2$) is not met, see line 139) and block 140 (see line 139). Per block 142, if either the first flag or the second flag was raised, the method 100 proceeds to block 146 (the fourth assessment module IV). If not, the method 100 is exited. In block 146 of FIG. 3, the controller C is configured to determine a theoretical minimum state of charge that is likely to be experienced by the user, as a difference between a lowest value of the state of charge within a predefined past period prior to a charging event and a predefined buffer or margin. The controller C may be programmed to save the lowest observed state of charge within a predefined past period (e.g., previous 60 days) prior to a charging event. For example, if the lowest observed state of charge within the last 60 days was 40% and the predefined buffer is selected to be 5%, the theoretical minimum state of charge would be the difference, i.e., 35%.

In block 148, the controller C is configured to determine a theoretical time for the state of charge disparity factor (dSOC) to reach the theoretical minimum state of charge, and whether the theoretical time is greater than a calibrated time. The theoretical time may be obtained as follows:

$$\text{Theoretical Time (days)} = \frac{\text{Number of Data Transmissions}}{2 * \text{daily average number of trips}}$$

$$\text{Number of Data Transmissions} = \frac{(\text{Theoretical Minimum} SOC - \text{Observed } dSOC)}{\text{Slope of } dSOC}$$

If the theoretical time is greater than a calibrated time, the method 100 proceeds to block 150, where a third flag is raised. The third flag may be configured to notify the user of a potential substantial fault and advise the user to seek servicing. The third flag may be configured to shift operation of the device 14 to an alternative operating mode, such as a "limp home" mode that restricts the power consumption and speed of the device 14. If the theoretical time is not greater than the calibrated time, the method 100 proceeds to block 152, where a fourth flag is raised. The fourth flag may be configured to inform the user of a potential moderate fault and advise the user to seek servicing.

In summary, the system 10 (via execution of method 100) generates multiple indicators based in part on the state of charge disparity factor, and filters the indicators to robustly detect potential early propulsion loss. Accordingly, the system 10 (and execution of the method 100) improves the functioning of the device 14 by providing control of the device 14, including raising one or more of the plurality of flags. The system 10 provides a technical advantage of reducing the occurrence of stalled devices due to propulsion loss and reducing false positive indicators of propulsion loss resulting from long-term parking scenarios. The system 100 incorporates cell recovery during charge-less parking and condition monitoring for self-balancing, The flowchart in FIG. 3 illustrates an architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by specific purpose hardware-based systems that perform the specified functions or acts, or combinations of specific purpose hardware and computer instructions. These computer program instructions may also be stored in a computer-readable medium that can direct a controller or other programmable data processing apparatus to function in a particular manner, such that the instructions stored in the computer-readable medium produce an article of manufacture including instructions to implement the function/act specified in the flowchart and/or block diagram block or blocks.

The controller C of FIG. 1 may be an integral portion of, or a separate module operatively connected to, other controllers of the device 14. The controller C includes a computer-readable medium (also referred to as a processor-readable medium), including a non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, other magnetic media, a CD-ROM, DVD, other optical media, punch cards, paper tape, other physical media with patterns of holes, a RAM, a PROM, an EPROM, a FLASH-EEPROM, other memory chips or cartridges, or other media from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

What is claimed is:

1. A system of controlling a device with a rechargeable energy storage pack having a plurality of cells, based on propulsion loss assessment, the system comprising:
   a controller including a processor and tangible, non-transitory memory on which instructions are recorded, execution of the instructions by the processor causing the controller to:
   obtain a state of charge and an open circuit voltage of the rechargeable energy storage pack;
   determine a first SOC line and a second SOC line such that a ratio of the state of charge and the open circuit voltage is a constant between the first SOC line and the second SOC line, the state of charge at and above the first SOC line being defined as a selected dataset;
   obtain a state of charge disparity factor (dSOC) from the selected dataset, the state of charge disparity factor (dSOC) being defined as a difference between a minimum value of the state of charge of the plurality of cells and an average value of the state of charge of the plurality of cells:
   obtain a plurality of parameters based in part on the state of charge disparity factor (dSOC); and
   control operation of the device based in part on the state of charge disparity factor (dSOC) and the plurality of parameters ($P_i$), including raising one or more of a plurality of flags each transmitting respective information to a user.

2. The system of claim 1, wherein the plurality of parameters ($P_i$) includes:
   a disparity mean ($M_t$) obtained over a window size of W data transmissions, the disparity mean ($M_t$) at a time t being defined as:

$$M_t = \frac{1}{W} \sum_{i=0}^{W-1} dSCO_{t-i}.$$

3. The system of claim 2, wherein the plurality of parameters ($P_i$) includes:
   a disparity slope ($S_t$) obtained over the window size of W data transmissions and based in part on the disparity mean ($M_t$), the disparity slope ($S_t$) at the time t being defined as:

$$S_t = \frac{\sum_{i=0}^{W-1} \left[\left(t - i - \frac{2t - W + 1}{2}\right) * (dSOC_{t-i} - M_t)\right]}{\sum_{i=0}^{W-1} \left(t - i - \frac{2t - W + 1}{2}\right)^2}.$$

4. The system of claim 2, wherein the plurality of parameters ($P_i$) includes:
   a disparity standard deviation ($SD_t$) obtained over the window size of W data transmissions and based in part on the disparity mean ($M_t$), the disparity standard deviation ($SD_t$) at the time t being defined as:

$$SD_t = \sqrt{\frac{\sum_{i=0}^{W-1}(dSOC_{t-i} - M_t)^2}{W-1}}.$$

5. The system of claim 1, wherein the controller is configured to:
  determine if the plurality of parameters ($P_i$) are each above respective thresholds ($T_i$);
  determine if the state of charge disparity factor is greater than a disparity threshold (dSOC>X); and
  if at least one of the plurality of parameters ($P_i$) each being above the respective thresholds ($T_i$) and the state of charge disparity factor being greater than the disparity threshold (dSOC>X) is true and has an occurrence above a first frequency threshold ($F_1$), then the controller is configured to raise a first one of the plurality of flags.

6. The system of claim 1, wherein:
  the controller is configured to receive an odometer reading of the device via a current data transmission;
  a charge-less parking instance is established if a difference in the odometer reading of the device at a time t and the odometer reading at a time t−1 is zero and an absolute value of a difference in the state of charge at the time t versus the state of charge at the time t−1 is less than a noise threshold;
  if the current data transmission was collected after the charge-less parking instance and a number of days that the device had been parked is greater than a predefined parking time threshold, then prior to obtaining the plurality of parameters, the controller is configured to modify the state of charge disparity factor by an off-time correction factor; and
  the off-time correction factor is based in part on the number of days that the device was parked.

7. The system of claim 1, wherein:
  if a current data transmission was collected after at least one of a charging instance and a driving instance, prior to obtaining the plurality of parameters, the controller is configured to modify the state of charge disparity factor by a balancing correction factor; and
  the balancing correction factor is based in part on a duration of the at least one of the charging instance and the driving instance.

8. The system of claim 1, wherein:
  the controller is configured to receive an odometer reading of the device via a current data transmission;
  a charge-less parking instance is established if a difference in an odometer reading of the device at a time t and the odometer reading at a time t−1 is zero and an absolute value of a difference in the state of charge at the time t versus the state of charge at the time t−1 is less than a noise threshold;
  if the current data transmission was collected after the charge-less parking instance, then the controller is configured to:
    determine an average cell recovery (ABS[$V_{t,\ avg} - V_{t-1,\ avg}$]) as an absolute value of a difference between an average voltage at the time t and the average voltage at the time t−1;
    determine a minimum cell recovery (ABS[$V_{t,\ min} - V_{t-1,\ min}$]) as the absolute value of a difference between a minimum voltage at the time t and the minimum voltage at the time t−1; and
    if an absolute value of a difference between the average cell recovery and the minimum cell recovery is non-zero and has an occurrence above a second frequency threshold ($F_2$), then the controller is configured raise a second one of the plurality of flags.

9. The system of claim 1, wherein the controller is configured to:
  determine a theoretical minimum state of charge based in part on a predefined buffer and a lowest value of the state of charge within a predefined past period prior to a charging event;
  determine a theoretical time for the state of charge disparity factor (dSOC) to reach the theoretical minimum state of charge; and
  if the theoretical time is greater than a calibrated time, then the controller is configured to raise a third one of the plurality of flags.

10. The system of claim 1, further comprising:
  a current sensor and a voltage sensor operatively connected to the rechargeable energy storage pack and configured to provide respective data to the controller; and
  wherein the state of charge data is based in part on the respective data from at least one of the current sensor and the voltage sensor.

11. A method of controlling operation of a device having a rechargeable energy storage pack with a plurality of cells based on propulsion loss assessment, the device having a controller with a processor and tangible, non-transitory memory, the method comprising:
  obtaining a state of charge and an open circuit voltage of the rechargeable energy storage pack, via the controller;
  determining a first SOC line and a second SOC line such that a ratio of the state of charge and the open circuit voltage is a constant between the first SOC line and the second SOC line, via the controller;
  defining the state of charge at and above the first SOC line as a selected dataset;
  determining a state of charge disparity factor (dSOC) at a time t from the selected dataset, the state of charge disparity factor (dSOC) being defined as a difference between a minimum value of a state of charge and an average value of the state of charge for the plurality of cells, via the controller;
  obtaining a plurality of parameters based in part on the state of charge disparity factor (dSOC); and
  controlling operation of the device based in part on the state of charge disparity factor (dSOC) and the plurality of parameters ($P_i$), including raising one or more of a plurality of flags each transmitting respective information to a user.

12. The method of claim 11, wherein obtaining the plurality of parameters includes:
  obtaining a disparity mean ($M_t$) at a time t over a window size of W data transmissions, as:

$$M_t = \frac{1}{W}\sum_{i=0}^{W-1} dSCO_{t-i}.$$

13. The method of claim 12, wherein obtaining the plurality of parameters includes:
  obtaining a disparity slope ($S_t$) at the time t over the window size of W data transmissions and based in part on the disparity mean ($M_t$), as:

$$S_t = \frac{\sum_{i=0}^{W-1}\left[\left(t-i-\frac{2t-W+1}{2}\right)*(dSOC_{t-i}-M_t)\right]}{\sum_{i=0}^{W-1}\left(t-i-\frac{2t-W+1}{2}\right)^2}.$$

14. The method of claim 12, wherein obtaining the plurality of parameters includes:
obtaining a disparity standard deviation ($SD_t$) at the time t over the window size of W data transmissions and based in part on the disparity mean ($M_t$), as:

$$SD_t = \sqrt{\frac{\sum_{i=0}^{W-1}(dSOC_{t-i}-M_t)^2}{W-1}}.$$

15. The method of claim 11, further comprising:
determining if the plurality of parameters ($P_i$) are each above respective thresholds ($T_i$), via the controller;
determining if the state of charge disparity factor is greater than a disparity threshold (dSOC>X), via the controller;
if at least one of the plurality of parameters ($P_i$) each being above the respective thresholds ($T_i$) and the state of charge disparity factor being greater than the disparity threshold (dSOC>X) is true and has an occurrence above a first frequency threshold ($F_1$), then raising a first one of the plurality of flags, via the controller.

16. The method of claim 11, further comprising:
establishing a charge-less parking instance if a difference in an odometer reading of the device at a time t and the odometer reading at a time t−1 is zero and an absolute value of a difference in the state of charge at the time t versus the state of charge at the time t−1 is less than a noise threshold, via the controller;
if a current data transmission was collected after the charge-less parking instance and a number of days that the device had been parked is greater than a predefined parking time threshold, then prior to obtaining the plurality of parameters, modifying the state of charge disparity factor by an off-time correction factor; and
obtaining the off-time correction factor based in part on the number of days that the device was parked.

17. The method of claim 11, further comprising:
if a current data transmission was collected after at least one of a charging instance and a driving instance, prior to obtaining the plurality of parameters, modifying the state of charge disparity factor by a balancing correction factor, via the controller; and
obtaining the balancing correction factor based in part on a duration of the at least one of the charging instance and the driving instance.

18. The method of claim 11, further comprising:
establishing a charge-less parking instance if a difference in an odometer reading of the device at a time t and the odometer reading at a time t−1 is zero and an absolute value of a difference in the state of charge at the time t versus the state of charge at the time t−1 is less than a noise threshold;
if a current data transmission was collected after the charge-less parking instance, then:
determining an average cell recovery (ABS[$V_{t,\ avg}-V_{t-1,\ avg}$]) as an absolute value of a difference between an average voltage at the time t and the average voltage at the time t−1, via the controller;
determining a minimum cell recovery (ABS[$V_{t,\ min}-V_{t-1,\ min}$]) as the absolute value of a difference between a minimum voltage at the time t and the minimum voltage at the time t−1, via the controller; and
if an absolute value of a difference between the average cell recovery and the minimum cell recovery is non-zero and has an occurrence above a second frequency threshold ($F_2$), then raising a second one of the plurality of flags, via the controller.

19. The method of claim 11, further comprising:
determining a theoretical minimum state of charge based in part on a predefined buffer and a lowest value of the state of charge within a predefined past period prior to a charging event, via the controller;
determining a theoretical time for the state of charge disparity factor (dSOC) to reach the theoretical minimum state of charge, via the controller; and
if the theoretical time is greater than a calibrated time, then raising a third one of the plurality of flags, via the controller.

* * * * *